(12) United States Patent
Liu et al.

(10) Patent No.: US 9,069,250 B2
(45) Date of Patent: Jun. 30, 2015

(54) ELECTROWETTING DISPLAY UNIT AND METHOD FOR MANUFACTURING THEREOF

(71) Applicant: INDUSTRIAL TECHNOLOGY RESEARCH INSTITUTE, Hsinchu (TW)

(72) Inventors: Yi-Chun Liu, Hsinchu County (TW); Shu-Wei Kuo, Hsinchu County (TW); Ping-Chen Chen, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 166 days.

(21) Appl. No.: 13/803,168

(22) Filed: Mar. 14, 2013

(65) Prior Publication Data

US 2014/0133009 A1    May 15, 2014

(30) Foreign Application Priority Data

Nov. 14, 2012    (TW) .............................. 101142513 A

(51) Int. Cl.
*G02B 26/00*    (2006.01)
*B01F 17/00*    (2006.01)
(Continued)

(52) U.S. Cl.
CPC ................ *G03F 7/20* (2013.01); *G02B 26/005* (2013.01); *G02B 2207/115* (2013.01)

(58) Field of Classification Search
CPC ..... G02F 1/67; G02F 2001/1678; G02F 1/19; G02F 1/0018; G02B 3/12; G02B 1/06; G02B 2207/115
USPC .............. 359/290, 665; 106/287.2, 106/287.24–287.26
See application file for complete search history.

(56) References Cited

U.S. PATENT DOCUMENTS 7,335,324 B2    2/2008    Huang et al.
7,732,081 B2    6/2010    Xie
(Continued)

FOREIGN PATENT DOCUMENTS

TW    200928430 A    7/2009
TW    M388645    9/2010
(Continued)

OTHER PUBLICATIONS

Intellectual Property Office, Ministry of Economic Affairs, R.O.C., "Notice of Allowance", Jun. 25, 2014, Taiwan.
(Continued)

*Primary Examiner* — Evelyn A Lester
(74) *Attorney, Agent, or Firm* — Morris Manning & Martin LLP; Tim Tingkang Xia, Esq.

(57) ABSTRACT

A method for manufacturing an electrowetting display unit includes the following steps. A first substrate and a second substrate are provided. A first conductive layer is disposed on one side of the first substrate. A second conductive layer is disposed on one side of the second substrate. A polymer layer, which includes a siloxane containing a light-induced cross linkable group and a Si—H bond, is disposed on the first conductive layer. The molecular weight of the monomer of the siloxane is equal to or greater than 5000. A part of the polymer layer is exposed to a light so as to form a plurality of hydrophobic sections. A hydrophilic section is developed by treating a developing agent. The hydrophilic section and the plurality of hydrophobic sections form a pattern layer together. Polar liquid and non-polar liquid are disposed between the pattern layer and the second conductive layer.

21 Claims, 12 Drawing Sheets

(51) Int. Cl.
  *C01B 25/00* (2006.01)
  *G03F 7/20* (2006.01)

(56) References Cited

U.S. PATENT DOCUMENTS

| | | | |
|---|---|---|---|
| 7,763,314 | B2 | 7/2010 | Dai et al. |
| 7,909,974 | B2 | 3/2011 | Bartels et al. |
| 2007/0040982 | A1* | 2/2007 | Nakano et al. ............. 349/149 |
| 2007/0047095 | A1* | 3/2007 | Jung et al. ................. 359/665 |
| 2007/0263306 | A1* | 11/2007 | Hayes et al. ............... 359/886 |
| 2010/0215968 | A1* | 8/2010 | Fields et al. ............... 428/447 |
| 2012/0037400 | A1 | 2/2012 | Fields et al. |
| 2012/0092573 | A1* | 4/2012 | Chen et al. ................. 349/15 |

FOREIGN PATENT DOCUMENTS

| | | |
|---|---|---|
| TW | 201213851 A | 4/2012 |
| TW | I366677 | 6/2012 |
| TW | 201239392 A | 10/2012 |
| TW | 201239905 A | 10/2012 |
| WO | 2011058019 A1 | 5/2011 |
| WO | 2011080224 A1 | 7/2011 |
| WO | 2011113787 A1 | 9/2011 |

OTHER PUBLICATIONS

Bin Zhao et al., Surface-Directed Liquid Flow Inside Microchannels, Science, 2001, p. 1023-1025, vol. 291.

Miroslav Colic at al., Chemisorption of Organofunctional Silanes on Silicon Nitride for Improved Aqueous Processing, J. Am. Ceram. Soc., 1998, p. 2157-2163, vol. 81, No. 8.

Shaun Berry et al., Irreversible Electrowetting on Thin Fluoropolymer Films, Langmuir, 2007, p. 12429-12435, vol. 23, No. 24.

James T. C. Wojtyk et al,, "Reagentless" Micropatterning of Organics on Silicon Surfaces: Control of Hydrophobic/Hydrophilic Domains, J. Am Chem. Soc., 2001, p. 1535-1536, vol. 123, No. 7.

S. Yang et al., Electrofluidic displays: Fundamental platforms and unique performance attributes, Journal of the SID, 2011, p. 608-613, vol. 19, No. 9.

* cited by examiner

ELECTROWETTING DISPLAY UNIT AND METHOD FOR MANUFACTURING THEREOF

CROSS-REFERENCE TO RELATED APPLICATIONS

This non-provisional application claims priority under 35 U.S.C. §119(a) on Patent Application No(s). 101142513 filed in Taiwan, R.O.C. on Nov. 14, 2012, the entire contents of which are hereby incorporated by reference.

TECHNICAL FIELD

The disclosure relates to a display unit and a method for manufacturing thereof.

BACKGROUND

Since 2003 Robert A. Hayes and B. J. Feenstra, from Philips Electronics N.V., published the earliest article about the electrowetting display on NATURE journal, the research about the electrowetting display has been developed increasingly because the structure and the material of the electrowetting display is simple and the manufacturing of the electrowetting display is uncomplicated.

Generally speaking, the electrowetting display includes polar liquid, hydrophobic ink, hydrophobic insulating layers, hydrophilic sidewalls, and transparent electrodes. The contact angle between the hydrophobic ink and the hydrophobic insulating layers may be changed by applying different voltages so as to control the color of the electrowetting display to be transformed.

When the voltage is not applied to the electrowetting display, the polar liquid is repelled by the surface of the hydrophobic insulating layers such that the hydrophobic ink is covered by the polar liquid so as to be evenly distributed. Otherwise, when the voltage is applied to the electrowetting unit, the charge induced by the voltage may attract the polar liquid so that the hydrophobic ink is pushed away by the polar liquid. Therefore, a bright mode and a dark mode of the electrowetting display are achieved by the polar liquid covering the hydrophobic ink or the polar liquid pushing the hydrophobic ink away. Furthermore, the moving region of the hydrophobic ink is restricted by the hydrophilic sidewalls so that different pixels are isolated.

According to the structure of the electrowetting display described above, the hydrophobic insulating layers play an important role in the electrowetting display. The hydrophobicity of the hydrophobic insulating layers must be good enough so that the polar liquid may be repelled by the surface of the hydrophobic insulating layers and the hydrophobic ink may be covered by the polar liquid. On the other hand, the hydrophobic insulating layers must be connected to the hydrophilic sidewalls. However, the surface energy of the hydrophobic insulating layers cannot match the surface energy of the hydrophilic sidewalls, which leads to bad attachment of the hydrophilic sidewalls to the hydrophobic insulating layers as well as hard manufacturing of the electrowetting display for large area. Moreover, the material with superior hydrophilicity cannot be used for the hydrophilic sidewalls, which limits the hydrophilicity of the sidewalls and may lead to oil overflow while driving. Also, designers can not reduce the thickness of the electrowetting display because higher sidewalls are required to prevent oil from overflowing.

Therefore, now designers need to solve the problem met in the previous electrowetting display that the surface tension mismatch between the hydrophobic insulating layers and the hydrophilic sidewalls and the thickness of the electrowetting display cannot be further reduced.

SUMMARY

According to an embodiment, a method for manufacturing electrowetting display unit is disclosed. In the method, a first substrate and a second substrate are provided. A first conductive layer is disposed on a surface of the first substrate, and the surface of the first substrate faces the second substrate. A second conductive layer is disposed on a surface of the second substrate, and the surface of the second substrate faces the first substrate. A polymer layer, which includes a siloxane containing a light-induced cross linkable group and a Si—H bond, is disposed on the first conductive layer. The molecular weight of the monomer of the siloxane is equal to or greater than 5000. A part of the polymer layer is exposed to a light so as to form a plurality of hydrophobic sections. A hydrophilic section is formed by developing with a developing agent. The plurality of hydrophobic sections are surrounded by the hydrophilic section. The hydrophilic section and the plurality of hydrophobic sections form a pattern layer together. Polar liquid and non-polar liquid are disposed between the pattern layer and the second conductive layer.

According to another embodiment, an electrowetting display unit is disclosed. The electrowetting display unit includes a first substrate, a second substrate, a first conductive layer, a second conductive layer, a pattern layer, polar liquid, and non-polar liquid. The first substrate is opposite to the second substrate. The first conductive layer is disposed on a surface of the first substrate, and the surface of the first substrate faces the second substrate. The second conductive layer is disposed on a surface of the second substrate, and the surface of the second substrate faces the first substrate. The pattern layer is disposed on the first conductive layer. The pattern layer includes a plurality of hydrophobic sections and a hydrophilic section. The plurality of hydrophobic sections are surrounded by the hydrophilic section. The hydrophilic section includes a siloxane containing a Si—OH bond. The plurality of hydrophobic sections include a non-polar siloxane. The polar liquid and the non-polar liquid are between the pattern layer and the second conductive layer.

BRIEF DESCRIPTION OF THE DRAWINGS

The disclosure will become more fully understood from the detailed description given herein below for illustration only, and thus does not limit to the disclosure, and wherein.

DETAILED DESCRIPTION

Figure 1:
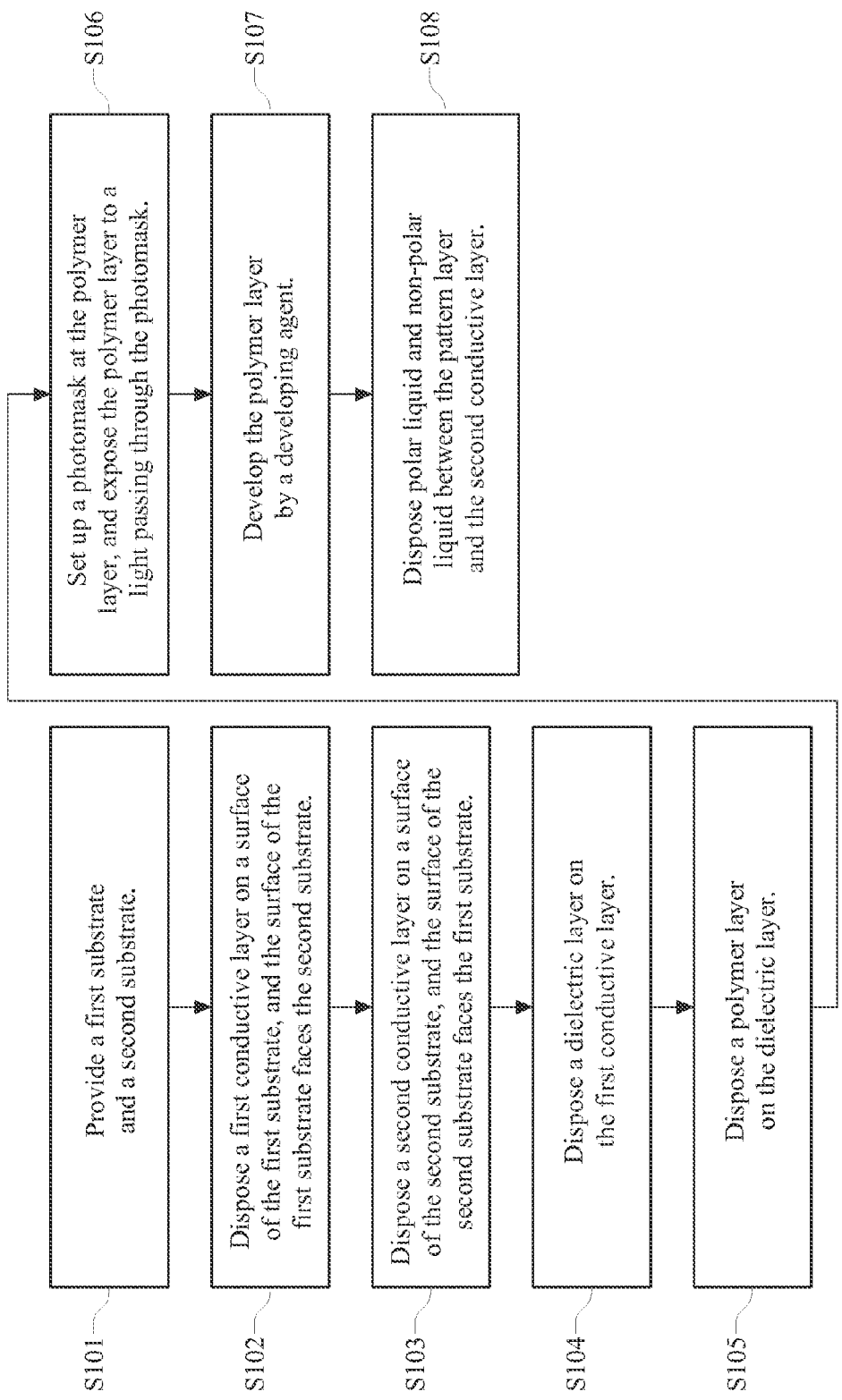
FIG. 1 is a flow chart of a method for manufacturing an electrowetting display unit according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
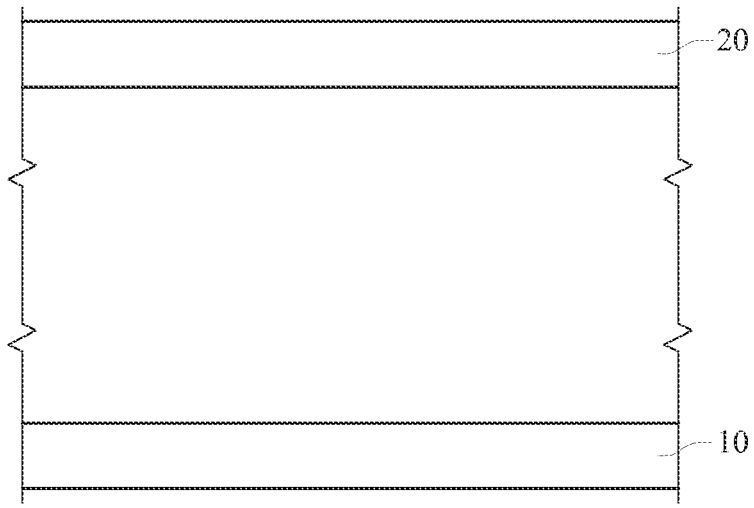
FIG. 2A to FIG. 2H are side views of a part of the electrowetting display unit corresponding to the step S101 to the step S108 in FIG. 1.
Figure 2B:
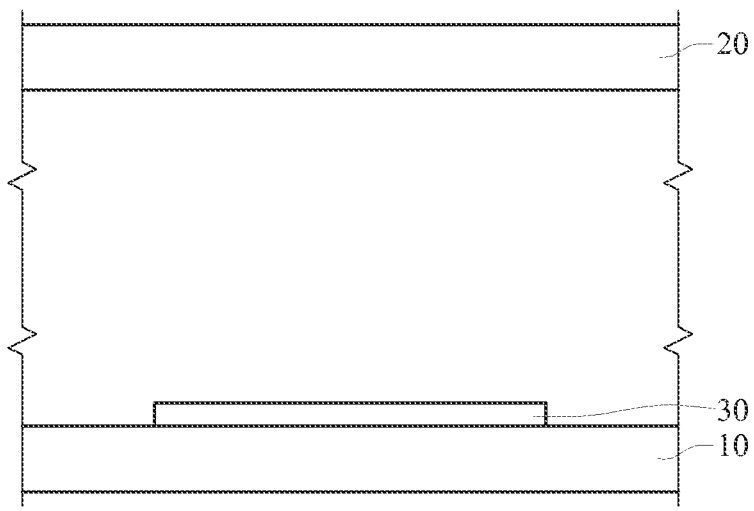
Figure 2C:
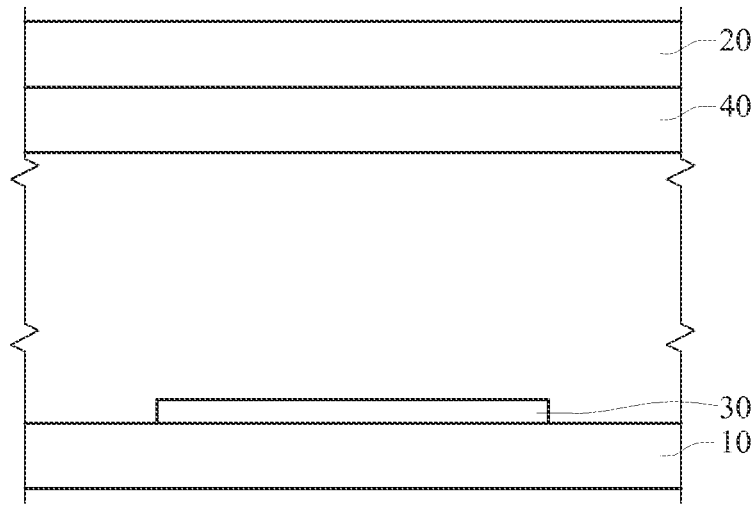
Figure 2D:
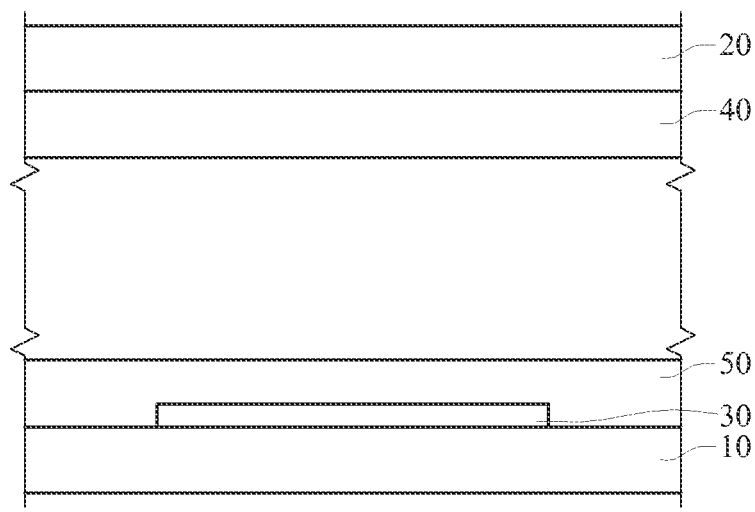
Figure 2E:
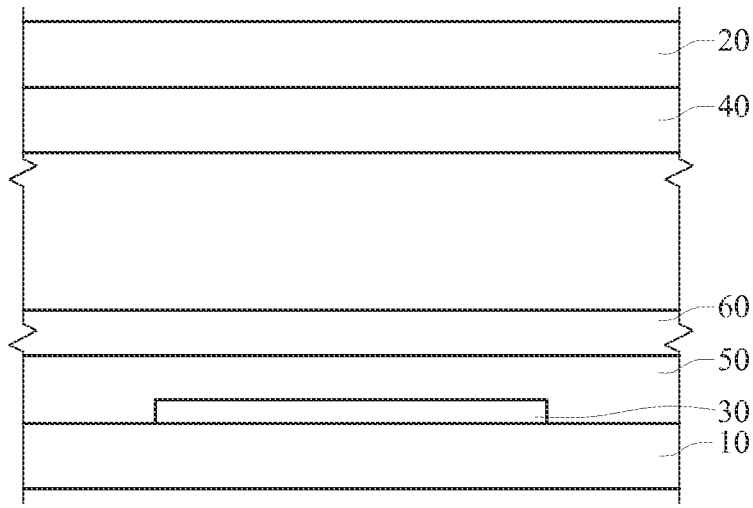
Figure 2F:
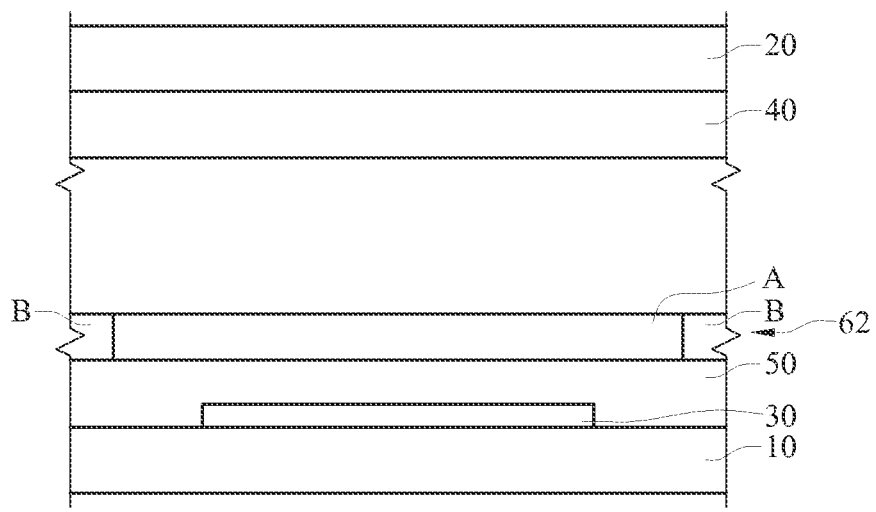
Figure 2G:
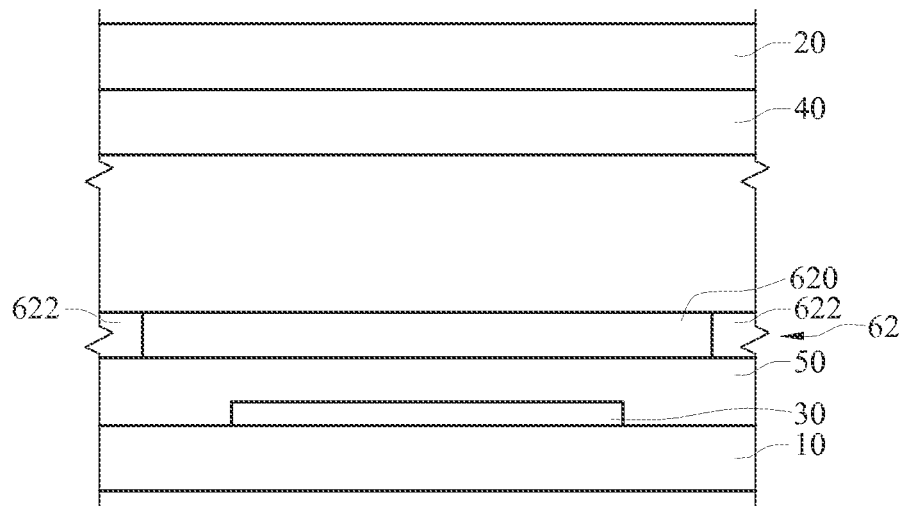
Figure 2H:
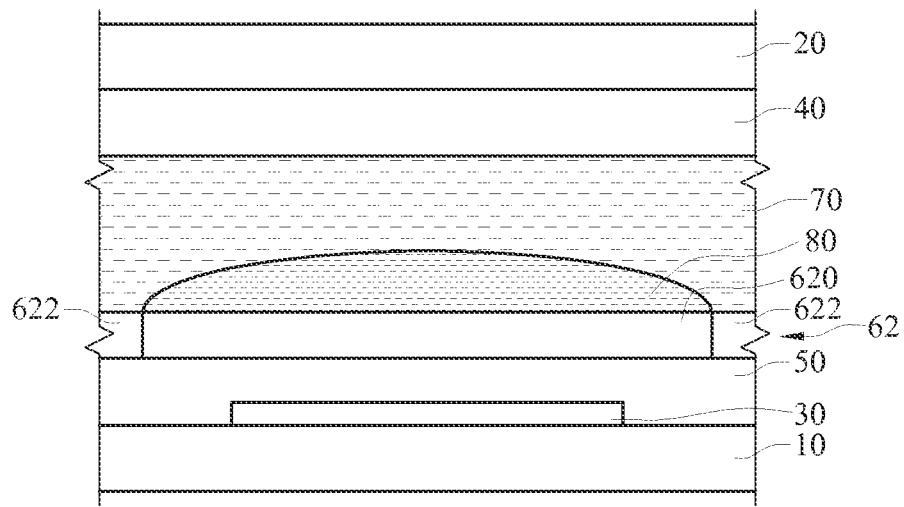
Figure 3A:
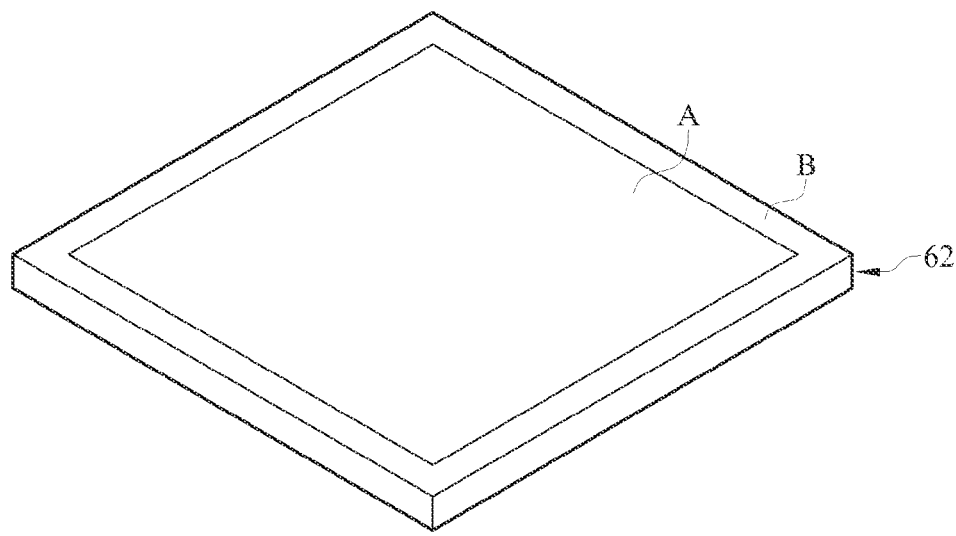
FIG. 3A is a perspective view of the pattern layer corresponding to FIG. 2F.
Figure 3B:
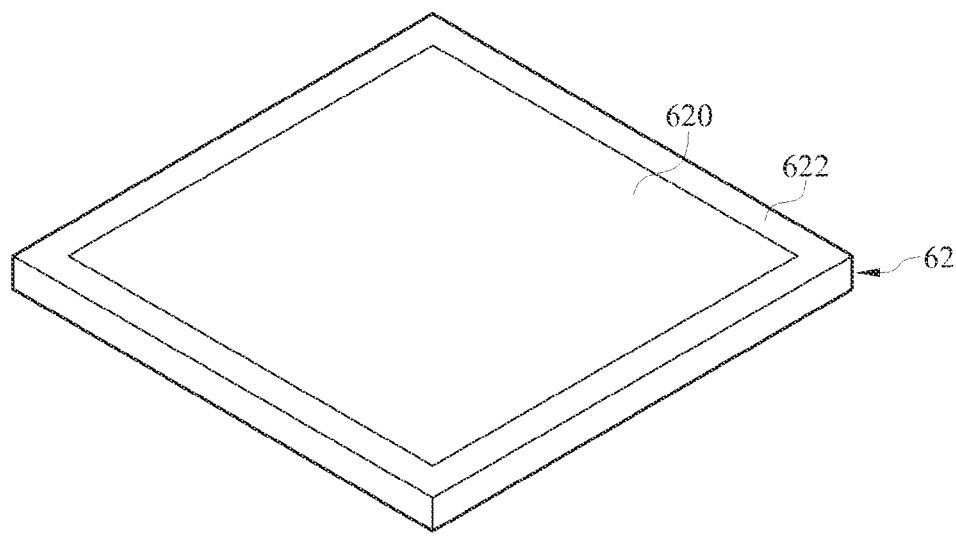
FIG. 3B is a perspective view of the pattern layer corresponding to FIG. 2G.

First, please refer to FIGS. 1 to 3B. FIG. 1 is a flow chart of a method for manufacturing an electrowetting display unit according to an embodiment of the disclosure. FIG. 2A to FIG. 2H are side views of a part of the electrowetting display unit corresponding to the step S101 to the step S108 in FIG. 1. FIG. 3A is a perspective view of the pattern layer corresponding to FIG. 2F. FIG. 3B is a perspective view of the pattern layer corresponding to FIG. 2G. For the following descriptions, an electrowetting display unit is described as well as a pixel of the electrowetting display unit is shown in the FIGs as an example.

First, a first substrate 10 and a second substrate 20 are provided and an interval is kept between the first substrate 10 and the second substrate 20 (S101, as shown in FIG. 2A). In this embodiment, the first substrate 10 and the second substrate 20 are made of glass.

Then, a first conductive layer 30 is disposed on a surface of the first substrate 10, and the surface of the first substrate 10 faces the second substrate 20. The disposing method is sputtering (S102, as shown in FIG. 2B), but does not limit to the disclosure. In this embodiment, the first conductive layer 30 is an indium tin oxide (ITO) film, but does not limit to the disclosure.

Afterwards, a second conductive layer 40 is disposed on a surface of the second substrate 20, and the surface of the second substrate 20 faces the first substrate 10. The disposing method is sputtering (S103, as shown in FIG. 2C), but not limit to the disclosure. In this embodiment, the second conductive layer 40 is an indium tin oxide (ITO) film, but does not limit to the disclosure.

In this embodiment, the first substrate 10 and the second substrate 20 are kept by an interval first. Then, the first conductive layer 30 is disposed on the first substrate 10 before the second conductive layer 40 is disposed on the second substrate 20. However, the order of keeping the first substrate 10 and the second substrate 20 by an interval, disposing the first conductive layer 30 on the first substrate 10, and disposing the second conductive layer 40 on the second substrate 20 does not limit to the disclosure. In other embodiments, the second conductive layer 40 may be disposed on the second substrate 20 first, then, the first conductive layer 30 is disposed on the first substrate 10 before the first substrate 10 and the second substrate 20 are kept by an interval.

Then, in this embodiment, a dielectric layer 50 is disposed on the first conductive layer 30 (S104, as shown in FIG. 2D). The constitution of the dielectric layer 50 is the material including high dielectric constant. The dielectric layer 50 may be silicon nitride ($Si_3N_4$) or silicon dioxide ($SiO_2$), but the disclosure is not limited thereto. The dielectric layer 50 is disposed on the first conductive layer 30 by sputtering, but not limited to sputtering. In other embodiment, the dielectric layer may be an organic polymer and coated on the first conductive layer 30.

Afterwards, a polymer layer 60 is disposed on the dielectric layer 50 by coating. The disposing method may be coating (S105, as shown in FIG. 2E), but not limit to the disclosure. In the embodiment, the structure of the polymer layer 60 is strengthened so that the polymer layer 60 can avoid being crashed by electric drive. However, the dielectric layer 50 does not limit to the disclosure. In other embodiments, a polymer layer 60 including a high dielectric constant may be disposed on the first conductive layer 30 so that the dielectric layer 50 does not need to be disposed, and the polymer layer 60 can avoid being crashed by electric drive. The polymer layer 60 includes a siloxane containing a light-induced cross linkable group and a Si—H bond. The structural formula of the siloxane is

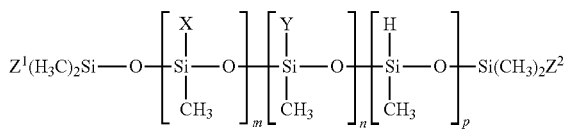

X presents a light-induced cross linkable group, Y presents an organic group, $Z^1$ and $Z^2$ present a hydrogen or an organic group, and m, n, and p are integers or 0. When p is 0, then at least one of $Z^1$ and $Z^2$ is a hydrogen. The organic group may be an alkyl group, but the disclosure is not limited thereto. In this embodiment, the light-induced cross linkable group may include a carbon-carbon double bond, e.g., an ethylene group, an acryl group, or a methacryl group. In other embodiments, the light-induced cross linkable groups may include an epoxy group, e.g., 1,2-epoxy group. The molecular weight of the siloxane is equal to or greater than 5,000.

In this embodiment and some other embodiments, the polymer layer 60 further includes a light-induced cross linking accelerator adapted for enhancing the reaction rate of the light-induced crossing linking reaction. The light-induced cross linking accelerator may be a platinum catalyst (e.g., platinum(II), acetylacetonate), a radical generator (e.g., azobisisobutyronitrile), or a cation generator (e.g., hydrochloric acid).

The molecular weight of the siloxane may be adjusted so that the electrowetting display unit including the polymer layer 60 may have an appropriate contact angle with water. In detail, the greater the molecular weight of the siloxane is, the more extent of the light-induced cross linking reaction the siloxane reacts, and consequently the polarity of the siloxane is lowered after performing the light-induced cross linking reaction. As the siloxane has lower polarity, the contact angle of the siloxane with water is lowered. In one embodiment, the molecular weight of the siloxane is between 6,000 and 155,000. In another embodiment, the molecular weight of the siloxane is between 6,000 and 12,000. In these embodiments, the greater molecular weight the siloxane is, the greater the viscosity of the polymer layer 60 manufactured by the siloxane has. As the viscosity of the polymer 60 is increased, the manufacture of the electrowetting display unit is hardened accordingly.

Next, a photomask (not shown in the figures) is set up at the polymer layer 60, and a part of the polymer layer 60 is exposed to a light passing through the photomask. The polymer layer 60 undergoes a light-induced cross linking reaction and forms a pattern layer 62 (S106, as shown in FIG. 2F). In detail, the photomask includes at least one light-transmitting section (not shown in the figures) and at least one opaque section (not shown in the figures), while the light-transmitting section corresponds to the dielectric layer 50. When the polymer 60 is exposed to the light, the polymer 60 forms light irradiated sections A corresponding to the light-transmitting sections and a light covered section B corresponding to the opaque section, while the light irradiated sections A are surrounded by the light covered section B (as shown in FIG. 3A). The energy of the light matches the light-induced cross linkable group. In detail, when the light-induced cross linkable group is an alkenyl group containing a carbon-carbon double bond, the energy of the light may stimulate the electron of the carbon-carbon double bond, and the light-induced cross linkable group forms a radical so that the siloxane of the part of the polymer 60 undergoes the light-induced cross linking reaction. The light-induced cross linking accelerator may accelerate the formation of the radical so that the light-induced cross linking accelerator may accelerate the reaction rate of the light-induced cross linking reaction. Generally speaking, the greater the intensity of the light is, the lower the contact angle of the siloxane of the light irradiated sections A becomes. The light may be an ultraviolet light, a visible light, or an infrared light. The siloxane of the light irradiated sections A undergoes the following reaction:

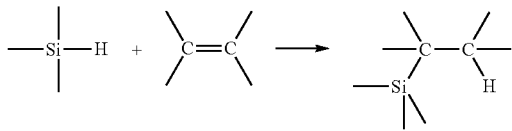

the C=C of the siloxane reacts with a Si—H bond of another siloxane, the Si—H bond of the siloxane in light irradiated sections A forms Si—C—C—R so that the siloxane does not include a Si—H bond.

Afterwards, a surface of the pattern layer 62 is developed by a developing agent (S107, as shown in FIG. 2G). The Si—H bonds of the siloxane in the light covered section B are transformed to Si—OH bonds by the developing agent. Therefore, the Si—H bonds of the siloxane in the light covered section B are transformed to hydrophilic groups. The contact angle of the light covered section B is lowered and the light covered section B is transformed to a hydrophilic section 622. On the other hand, the siloxane in the light irradiated sections A is inner to the developing agent because the light irradiated sections A lack any Si—H bonds. The siloxane in light irradiated sections A maintains hydrophobic and the light irradiated sections A are transformed to a plurality of hydrophobic sections 620. Wherein, the contact angle of the hydrophilic section 622 with water, $\theta_a$, is less than 90 degrees (°), the contact angle of the plurality of hydrophobic sections 620 with water, $\theta_b$, is greater than 100°, and the difference between $\theta_a$ and $\theta_b$ is greater than 30°. In this embodiment, the hydrophilic section 622 is discriminated from the plurality of hydrophobic sections 620 at the pattern layer 62. Moreover, the plurality of hydrophobic sections 620 are surrounded by the hydrophilic section 622 (as shown in FIG. 3B). Moreover, the developing agent may be a basic solution, but not limit to the disclosure. For instance, the basic solution is a $NaOH_{(aq)}$ or a $KOH_{(aq)}$.

In the following descriptions, several embodiments are provided to describe the pattern layer 62 and method for manufacturing thereof of the disclosure. Also, the hydrophilic section 622 and the plurality of hydrophobic sections 620 are tested.

Embodiment 1

First, provide 100 grams (g) of isopropyl alcohol (IPA) in a round bottom flask. Then, provide 1.0 g of (3-aminopropyl) triethoxysilane (Aldrich) in the round bottom flask and stir the solution. Afterwards, place the above solution in another round bottom flask, as well as provide 0.2 g of vinyl-terminated polydimethylsiloxane (molecular weight=6,000, product number: Gelest DMS-V21) and 7 milligrams (mg) of platinum(II) acetylacetonate (Aldrich) in the round bottom flask. The vinyl-terminated polydimethylsiloxane includes a Si—H bond, and the light-induced cross linkable group of the vinyl-terminated polydimethylsiloxane is an ethenyl group containing carbon-carbon bond. Next, stir the above solution at room temperature for 1 hour and then spin coat the solution on a substrate. The rotating speed of the spin coating is 3000 revolutions per minute (rpm) and the time of the spin coating is 20 seconds. Then, set up a photomask and expose an ultraviolet light with the wavelength of 365 nanometers (nm). The intensity of the exposure is 18000 milijoule/square centimeter ($mJ/cm^2$). Then, rinse the substrate by isopropyl alcohol. Afterwards, immerse the substrate into 0.1 M $NaOH_{(aq)}$ for 10 seconds. Finally, rinse the substrate by water and blow nitrogen to the substrate to dry the substrate. The manufacture of the pattern layer of the electrowetting display unit including coplanar hydrophilic section and hydrophobic sections in this embodiment is accomplished. The difference between the contact angle with water of the hydrophilic section and the contact angle with water of the plurality of hydrophobic sections is 73°. The contact angle with water of the hydrophilic section and the plurality of hydrophobic sections are listed as the following Table 1.

TABLE 1

| Section | Contact angle with water |
|---|---|
| Hydrophilic section | 30° |
| Hydrophobic sections | 103° |

Embodiment 2

In this embodiment, first, provide 100 g of isopropyl alcohol (IPA) in a round bottom flask. Then, provide 1.0 g of (3-aminopropyl)triethoxysilane (Aldrich) in the round bottom flask and stir the solution. Afterwards, place the above solution in another round bottom flask, as well as provide 0.2 g of vinyl-terminated polydimethylsiloxane (molecular weight=17,200, product number: Gelest DMS-V21) and 7 mg of platinum(II) acetylacetonate (Aldrich) in the round bottom flask. The vinyl-terminated polydimethylsiloxane includes a Si—H bond, and the light-induced cross linkable group of the vinyl-terminated polydimethylsiloxane is an ethenyl group containing carbon-carbon bond. Next, stir the above solution at room temperature for 1 hour and then spin coat the solution on a substrate. The rotating speed of the spin coating is 3000 rpm and the time of the spin coating is 20 seconds. Then, set up a photomask and expose an ultraviolet light with the wavelength of 365 nm. The intensity of the exposure is 18000 $mJ/cm^2$. Then, rinse the substrate by isopropyl alcohol. Afterwards, immerse the substrate into 0.1M $NaOH_{(aq)}$ for 10 seconds. Finally, rinse the substrate by water and blow nitrogen to the substrate to dry the substrate. The manufacture of the pattern layer of the electrowetting display unit including coplanar hydrophilic section and hydrophobic sections in this embodiment is accomplished. The difference between the contact angle with water of the hydrophilic section and the contact angle with water of the plurality of hydrophobic sections is 77°. The contact angle with water of the hydrophilic section and the plurality of hydrophobic sections are listed as the following Table 2.

TABLE 2

| Section | Contact angle with water |
|---|---|
| Hydrophilic section | 30° |
| Hydrophobic sections | 107° |

According to the pattern layers of the disclosure, the Si—H bonds of the siloxane in the light irradiated sections react with the light-induced cross linkable group, and the Si—H bonds of the siloxane in the light covered section are transformed to Si—OH bonds by the developing agent. Therefore, the siloxane in the light covered section becomes hydrophilic from hydrophobic, which achieves the polarity inversion of the siloxane in the light covered section. Consequently, the hydrophilic section and the plurality of hydrophobic sections coplanar with each other are formed on the pattern layer. The contact angle with water between the hydrophilic section and the plurality of hydrophobic sections are 73° and 77°, relatively. That is, the contact angle with water is larger. The electrowetting display unit manufactured may be thinner, and the oil overflowing of the electrowetting display unit is reduced.

After the surface of the pattern layer 62 is developed by the developing agent, both polar liquid 70 and non-polar liquid 80 are disposed between the pattern layer 62 and the second conductive layer 40 (S108, as shown in FIG. 2H). The polar liquid 70 may be water and the non-polar liquid 80 may be ink, but those do not limit to the disclosure. The polar liquid 70 and the non-polar liquid 80 are immiscible with each other. Therefore, the manufacture of the electrowetting display unit 8 in this embodiment is accomplished.

Figure 4A:
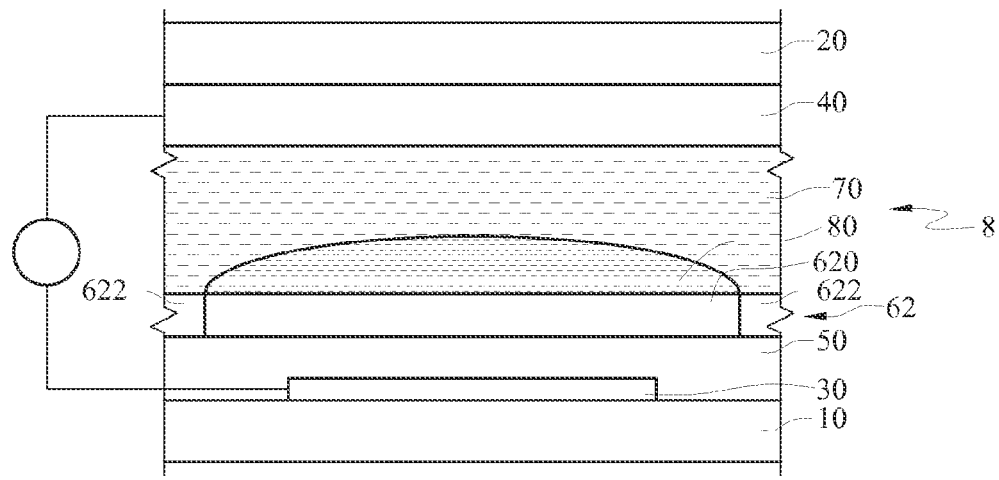
FIG. 4A is a side view of a part of the electrowetting display unit accomplished according to the steps in FIG. 1.
Figure 4B:
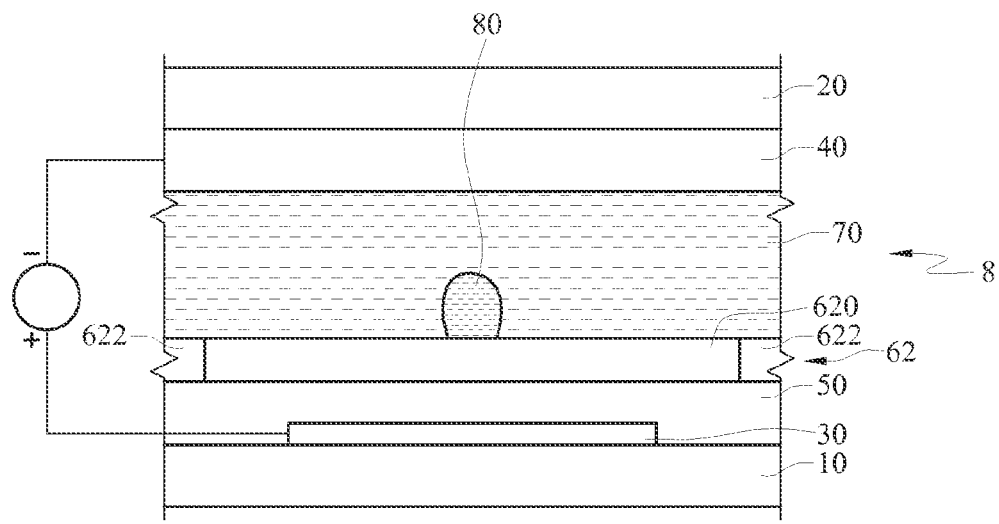
FIG. 4B is a side view of a part of the electrowetting display unit accomplished according to the steps in FIG. 1 when circuit is set up.

Please refer to FIGS. 4A and 4B, FIG. 4A is a side view of a part of the structure of the electrowetting display unit accomplished according to the steps in FIG. 1, and FIG. 4B is a side view of a part of the structure of the electrowetting display unit accomplished according to the steps in FIG. 1 when circuit is set up. When there is no voltage difference between the first conductive layer 30 and the second conductive layer 40, the plurality of hydrophobic sections 620 are covered by the non-polar liquid 80 as well as the non-polar liquid 80 and the hydrophilic section 622 are covered by the polar liquid 70 (as shown in FIG. 4A). Otherwise, when there is a voltage difference between the first conductive layer 30 and the second conductive layer 40, the non-polar liquid 80 is pushed away by the polar liquid 70 and the plurality of hydrophobic sections 620 are covered by the polar liquid 70 (as FIG. 4B). In the embodiments, the distribution of the polar liquid 70 and the non-polar liquid 80 at the plurality of hydrophobic sections 620 are varied as well as the switch of the "bright" mode and the "dark" mode of the electrowetting display unit 8 are alternated by applying voltage.

Figure 5:
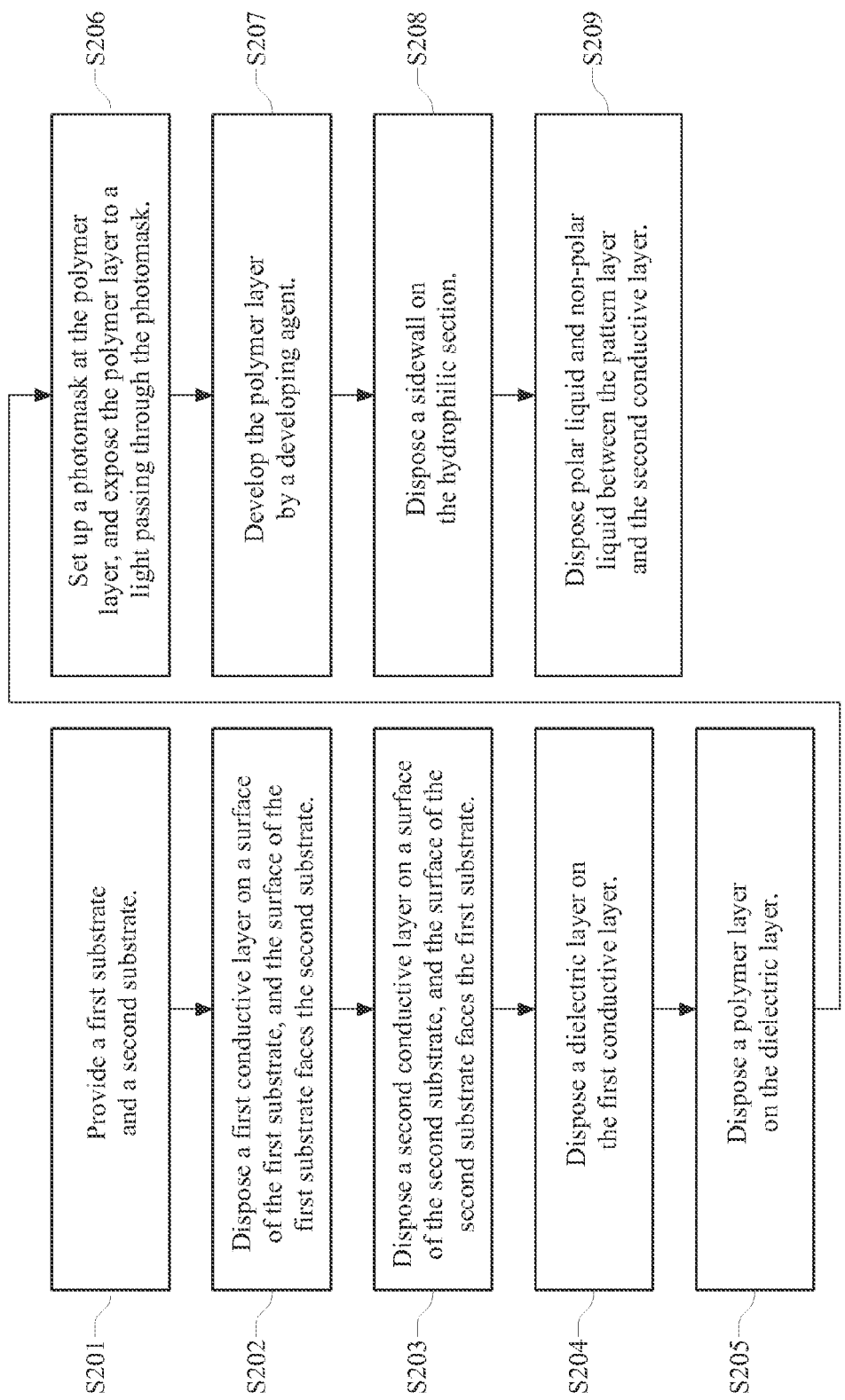
FIG. 5 is a flow chart of a method for manufacturing an electrowetting display unit according to another embodiment of the disclosure.
Figure 6A:
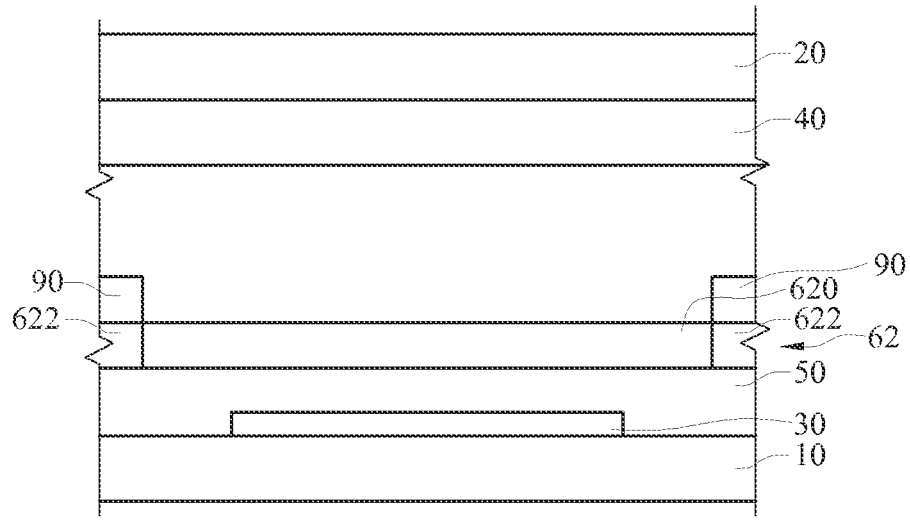
FIG. 6A is a side view of a part of the electrowetting display unit corresponding to the step S208 in FIG. 5.
Figure 6B:
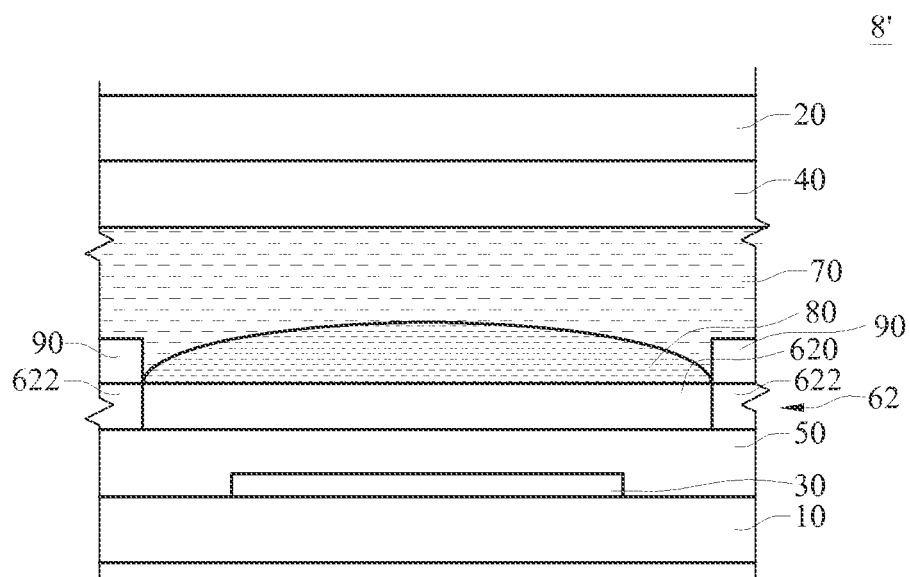
FIG. 6B is a side view of a part of the electrowetting display unit corresponding to the step S209 in FIG. 5.
Figure 7A:
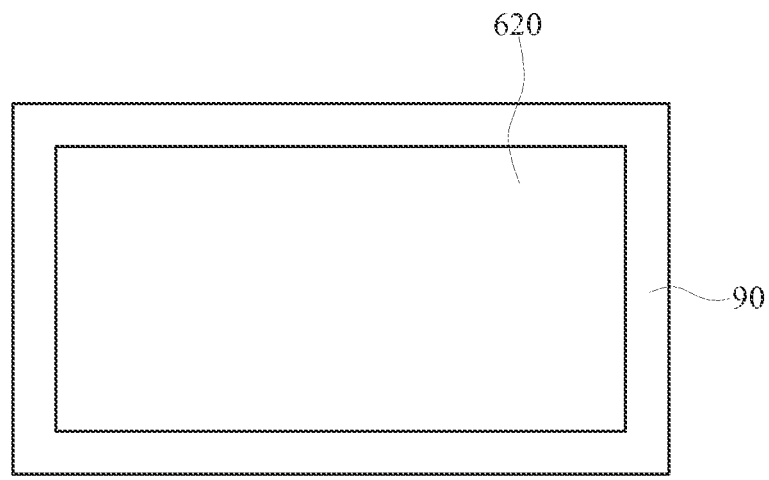
FIG. 7A to FIG. 7F are top views of the pattern layer and the sidewall of the electrowetting display unit according to other embodiments.
Figure 7B:
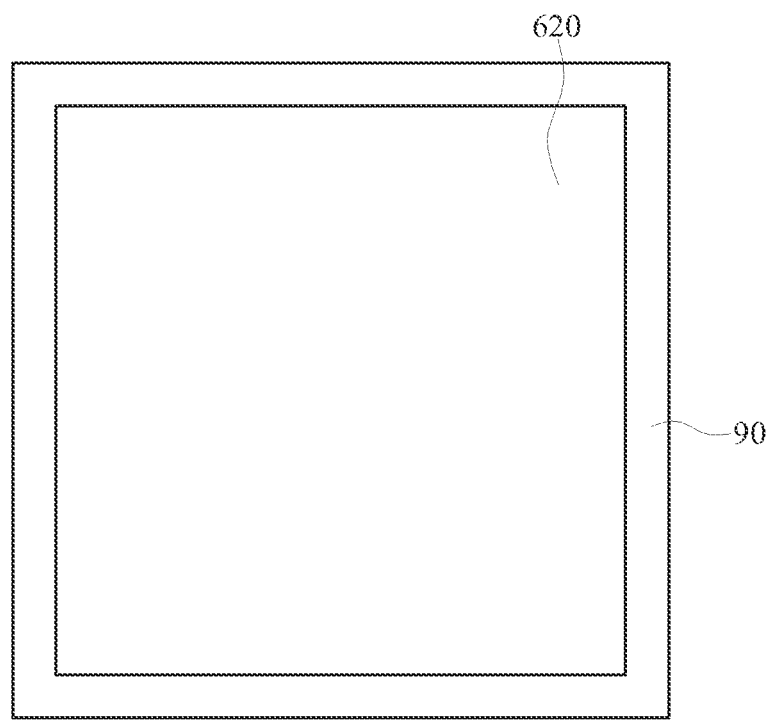
Figure 7C:
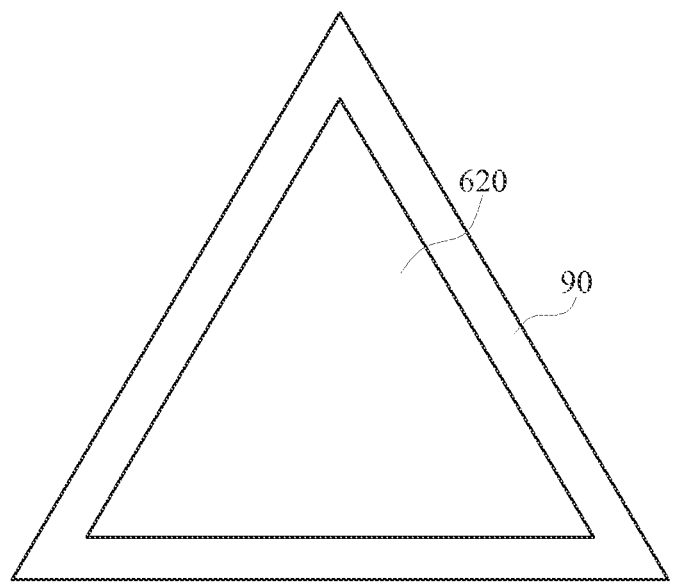
Figure 7D:
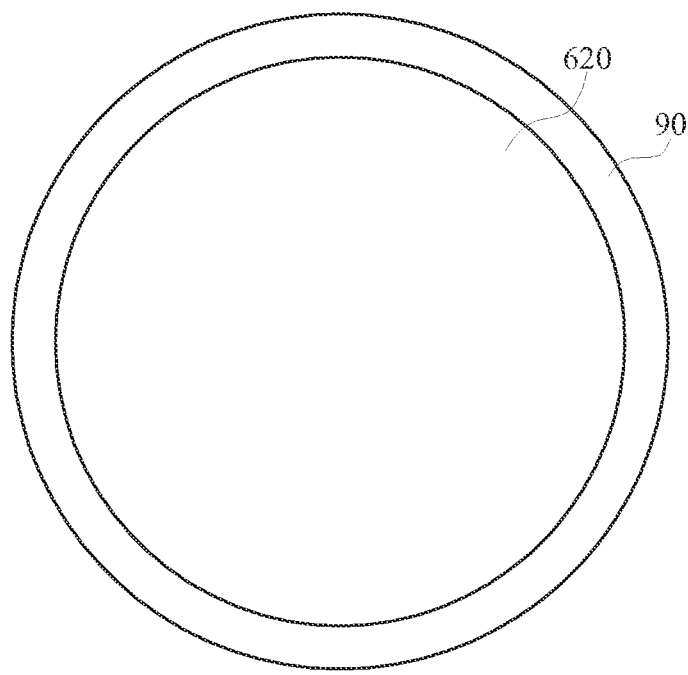
Figure 7E:
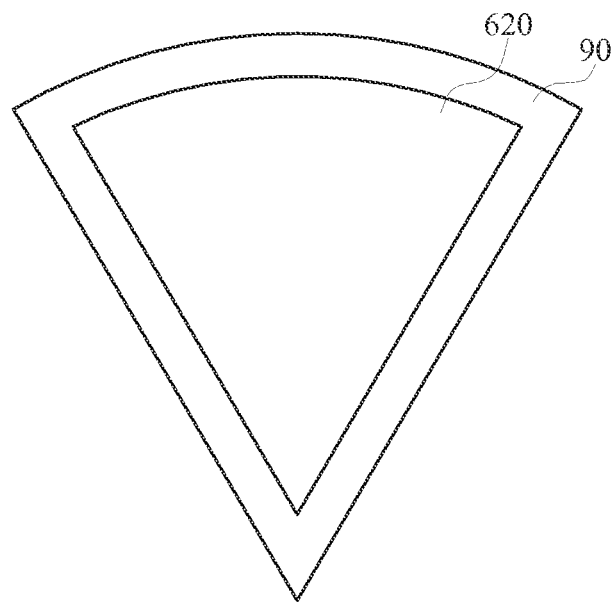
Figure 7F:
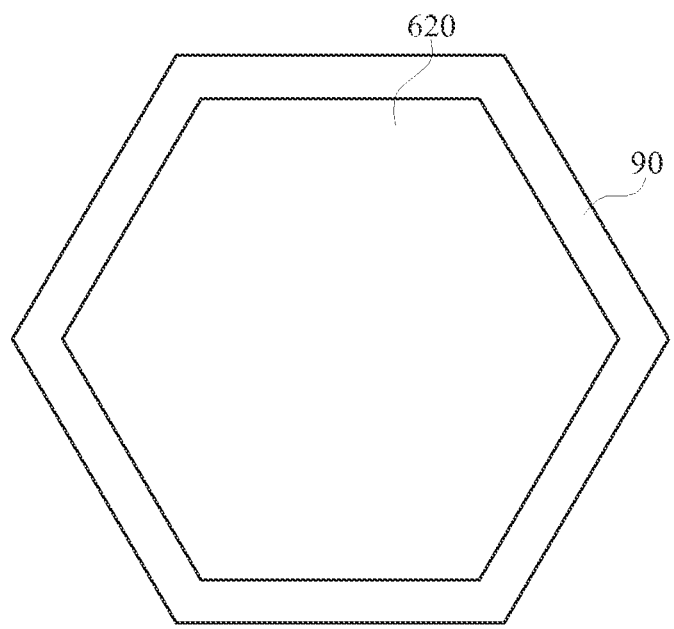

Please refer to FIGS. 5 to 7F. FIG. 5 is a flow chart of a method for manufacturing an electrowetting display unit according to another embodiment of the disclosure. FIG. 6A is a side view of a part of the structure of the electrowetting display unit corresponding to the step S208 in FIG. 5. FIG. 6B is a side view of a part of the structure of the electrowetting display unit corresponding to the step S209 in FIG. 5. FIG. 7A to FIG. 7F are top views of the pattern layer and the sidewall of the electrowetting display unit according to other embodiments. This embodiment is similar to the embodiment in FIG. 1, wherein similar symbols present the same or similar units, so only the differences between the embodiments are described in detail.

In this embodiment, step S201 to S207 are similar to step S101 to S107, while the difference is that a sidewall is disposed on the pattern layer 62 before both the polar liquid 70 and the non-polar liquid 80 are disposed between the pattern layer 62 and the second conductive layer 40 in the embodiment of step S201 to S207. The method for manufacturing S201 to S207 is similar to FIG. 1. After the pattern layer 62 is developed by a developing agent, a sidewall 90 is disposed on the hydrophilic section 622. The plurality of hydrophobic sections 620 are surrounded by the sidewall 90 (S208) (as FIG. 6A). In detail, a hydrophilic positive photoresist is coated on the pattern layer 62. The hydrophilic positive photoresist may be phenol formaldehyde resin, but not limit to the disclosure. Then, a photomask is set up, the photoresist is exposed, and the hydrophilic positive photoresist at the exposure sections is rinsed by a basic solution. The basic solution may be $NaOH_{(aq)}$, but the disclosure is not limited thereto. Therefore, the sidewall 90 is disposed on the pattern layer 62. The height of the sidewall 90 is between 3 to 50 μm. In another embodiment, the height of the sidewall 90 may be lower than 6 μm. The sidewall 90 is an enclosed wall. The shape of the sidewall 90 may be adjusted according to a user need. The shape of the wall may be a rectangle (as FIG. 7A), a square (as FIG. 7B), a triangle (as FIG. 7C), a circular (as FIG. 7D), a sector (as FIG. 7E), or a hexagon (as FIG. 7F). In this embodiment, the sidewall 90 may strengthen the structure of the electrowetting display unit 8', and reduce the oil overflowing of the electrowetting display unit.

Finally, both polar liquid 70 and non-polar liquid 80 are disposed between the pattern layer 62 and the second conductive layer 40 (as FIG. 2H). The polar liquid 70 may be water and the non-polar liquid 80 may be ink, but not limit to the disclosure. The polar liquid 70 and the non-polar liquid 80 are immiscible with each other. Thus, the manufacture of the electrowetting display unit 8' in this embodiment is accomplished.

According to the embodiments of the disclosure, the Si—H bonds of the siloxane in the light irradiated sections react with the light-induced cross linkable group, and the Si—H bonds of the siloxane in the light covered section are transformed to Si—OH bonds by the developing agent. Therefore, the siloxane in the light covered section becomes hydrophilic from hydrophobic, which achieves the polarity inversion of the siloxane in the light covered section. Consequently, the hydrophilic section and the plurality of hydrophobic sections coplanar with each other are formed on the pattern layer. The contact angle with water between the hydrophilic section and the plurality of hydrophobic sections is larger. The electrowetting display unit manufactured may be thinner, and the oil overflowing of the electrowetting display unit may be reduced.

Moreover, in some embodiments, a sidewall may be disposed on the hydrophilic section to strengthen the structure of the electrowetting display unit, and the probability of the electrowetting display unit oil overflowing may be further lowered.

What is claimed is:
1. A method for manufacturing an electrowetting display unit, comprising:

providing a first substrate and a second substrate;

disposing a first conductive layer on a surface of the first substrate, and the surface of the first substrate facing the second substrate;

disposing a second conductive layer on a surface of the second substrate, and the surface of the second substrate facing the first substrate;

disposing a polymer layer on the first conductive layer, the polymer layer including a siloxane containing a light-induced cross linkable group and a Si—H bond, and the molecular weight of the siloxane being equal to or greater than 5000;

exposing a part of the polymer layer to a light so as to form a plurality of hydrophobic sections;

forming a hydrophilic section by developing with a developing agent, the hydrophilic section surrounding the plurality of hydrophobic sections, and the hydrophilic section and the plurality of hydrophobic sections forming a pattern layer together; and disposing polar liquid and non-polar liquid between the pattern layer and the second conductive layer.

2. The method for manufacturing the electrowetting display unit according to claim 1, wherein the contact angle of the hydrophilic section with water is $\theta_a$, the contact angle of the plurality of hydrophobic sections with water is $\theta_b$, and the hydrophilic section and the plurality of hydrophobic sections satisfy the following conditions:

$\theta_a < 90°$;

$\theta_b > 100°$; and $|\theta_a - \theta_b| > 30°$.

3. The method for manufacturing the electrowetting display unit according to claim 1, wherein the light-induced cross linkable group is an ethylene group, an acryl group, a methacryl group, or a 1,2-epoxy group.

4. The method for manufacturing the electrowetting display unit according to claim 1, wherein the molecular weight of the siloxane is between 6,000 and 155,000.

5. The method for manufacturing the electrowetting display unit according to claim 1, wherein the structural formula of the siloxane is:

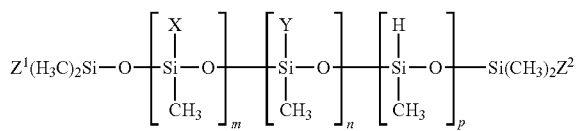

wherein, X presents the light-induced cross linkable group, Y presents an organic group, $Z^1$ and $Z^2$ present a hydrogen or an organic group, and the siloxane satisfies the following conditions:

$m \geq 0$;

$n \geq 0$;

$p \geq 0$; and m, n, or p are 0 or an integer.

6. The method for manufacturing the electrowetting display unit according to claim 5, wherein when p is 0, at least one of $Z^1$ and $Z^2$ is a hydrogen.

7. The method for manufacturing the electrowetting display unit according to claim 1, wherein the polymer layer further includes a light-induced cross linking accelerator.

8. The method for manufacturing the electrowetting display unit according to claim 7, wherein the light-induced cross linking accelerator is a platinum catalyst, a radical generator, or a cation generator.

9. The method for manufacturing the electrowetting display unit according to claim 1, after forming the hydrophilic section by developing with the developing agent, further comprising disposing a dielectric layer on the first conductive layer.

10. The method for manufacturing the electrowetting display unit according to claim 1, after forming the hydrophilic section by developing with the developing agent, further comprising disposing a sidewall on the hydrophilic section.

11. The method for manufacturing the electrowetting display unit according to claim 1, wherein the plurality of hydrophobic sections are covered by the non-polar liquid as well as the non-polar liquid and the hydrophilic section are covered by the polar liquid when there is no voltage difference between the first conductive layer and the second conductive layer.

12. The method for manufacturing the electrowetting display unit according to claim 1, wherein the developing agent is a basic solution.

13. An electrowetting display unit, including:

a first substrate;

a second substrate opposite to the first substrate;

a first conductive layer disposed on a surface of the first substrate, and the surface of the first substrate facing the second substrate;

a second conductive layer disposed on a surface of the second substrate, and the surface of the second substrate facing the first substrate;

a pattern layer disposed on the first substrate, the pattern layer including a plurality of hydrophobic sections and a hydrophilic section, the hydrophilic section surrounding the plurality of hydrophobic sections, the hydrophilic section and the plurality of hydrophobic sections being coplanar, the hydrophilic section including a siloxane containing a Si—OH bond, and the plurality of hydrophobic sections including non-polar siloxane; and polar liquid and non-polar liquid, and both the polar liquid and the non-polar liquid being between the pattern layer and the second conductive layer.

14. The electrowetting display unit according to claim 13, wherein the contact angle of the hydrophilic section with water is $\theta_a$, the contact angle of the plurality of hydrophobic sections with the water is $\theta_b$, and the electrowetting display unit satisfies the following conditions:

$\theta_a < 90°$;

$\theta_b > 100°$; and $|\theta_a - \theta_b| > 30°$.

15. The electrowetting display unit according to claim 13, further including a dielectric layer disposed between the first conductive layer and the pattern layer.

16. The electrowetting display unit according to claim 13, further including a sidewall disposed on the hydrophilic section.

17. The electrowetting display unit according to claim 16, wherein the height of the sidewall is between 6 μm and 50 μm.

18. The electrowetting display unit according to claim 16, wherein the sidewall is an enclosed wall.

19. The electrowetting display unit according to claim 18, wherein the shape of the sidewall is rectangle, square, triangle, circle, sector, or hexagon.

20. The electrowetting display unit according to claim 13, wherein the polar liquid and the non-polar liquid are immiscible with each other.

21. The electrowetting display unit according to claim 13, wherein the plurality of hydrophobic sections are covered by the non-polar liquid as well as the non-polar liquid and the hydrophilic section are covered by the polar liquid when there's no voltage difference between the first conductive layer and the second conductive layer.

* * * * *